US005974506A

United States Patent [19]
Sicola et al.

[11] Patent Number: 5,974,506
[45] Date of Patent: *Oct. 26, 1999

[54] ENABLING MIRROR, NONMIRROR AND PARTIAL MIRROR CACHE MODES IN A DUAL CACHE SYSTEM

[75] Inventors: Stephen J. Sicola, Monument; Wayne H. Umland, Colorado Springs; Thomas F. Fava, Colorado Springs; Clark E. Lubbers, Colorado Springs; Susan G. Elkington, Colorado Springs, all of Colo.

[73] Assignee: Digital Equipment Corporation, Maynard, Mass.

[ * ] Notice: This patent issued on a continued prosecution application filed under 37 CFR 1.53(d), and is subject to the twenty year patent term provisions of 35 U.S.C. 154(a)(2).

[21] Appl. No.: 08/671,153
[22] Filed: Jun. 28, 1996
[51] Int. Cl.$^6$ ....................................................... G06F 11/00
[52] U.S. Cl. ............................ 711/120; 711/119; 711/129; 711/161; 711/162; 711/170; 711/173
[58] Field of Search ..................................... 395/467, 445, 395/182.04, 182.03, 440, 183.12, 447, 456; 711/149, 118, 113, 120, 129

[56] References Cited

U.S. PATENT DOCUMENTS

| | | | |
|---|---|---|---|
| 5,133,059 | 7/1992 | Ziegler et al. ........................... | 395/467 |
| 5,274,799 | 12/1993 | Brant et al. .......................... | 395/182.04 |
| 5,410,669 | 4/1995 | Biggs et al. ............................. | 395/445 |
| 5,526,482 | 6/1996 | Stallmo et al. ..................... | 395/182.04 |
| 5,548,711 | 8/1996 | Brant et al. ......................... | 395/182.03 |
| 5,586,291 | 12/1996 | Lasker et al. ........................... | 395/440 |
| 5,586,293 | 12/1996 | Baron et al. ........................... | 395/445 |
| 5,617,530 | 4/1997 | Stallmo et al. ..................... | 395/183.12 |

Primary Examiner—Tod R. Swann
Assistant Examiner—Fred F. Tzeng
Attorney, Agent, or Firm—Ronald C. Hudgens

[57] ABSTRACT

A cache memory system is enabled into one of a plurality of cache modes in a cache memory system in a computer. The cache memory system has a first controller and two cache memories, the cache memories are partitioned into quadrants with two quadrants in each cache memory. A cache mode detector in the first controller detects a mirror cache mode set for the cache memory system. An address enabler in the first controller enables access to first pair of quadrants, one quadrant in each cache memory, in response to detection of a mirror cache mode. A second controller follows the cache mode set by the cache mode detector and has an address enabler. The address enabler in the second controller enables access to both quadrants in one cache memory in a non-mirror cache mode, and enables the access to a second pair of quadrants, one quadrant in each cache memory, in response to detection of a mirror cache mode by said cache mode detector.

16 Claims, 7 Drawing Sheets

ENABLING MIRROR, NONMIRROR AND PARTIAL MIRROR CACHE MODES IN A DUAL CACHE SYSTEM

CROSS REFERENCE TO RELATED APPLICATIONS

The following copending, commonly assigned patent applications, concurrently filed herewith, describe control operations used with the present invention and are hereby incorporated by reference.

1. "Simultaneous Mirror Write Cache" by Tom Fava, et al., filed concurrently herewith.

2. "Controls for Dual Controller Dual Cache Memory System" by Clark Lubber, et al., filed concurrently herewith.

1. Field of the Invention

This invention relates to enabling cache modes in a cache system having parallel cache memories and parallel cache controllers for the cache memories. More particularly, the invention relates to enabling a mirror write and a non-mirror write to all, or a portion of, each of the cache memories in the cache systems.

2. Description of the Related Art

To date, cache memory systems where there is a mirror write operation have used two separate memory caches and written the mirrored word first in one cache, read it from that cache, and written it to the second cache. The advantage of writing a data word to two separate cache modules is the greatly enhanced reliability of the cache memory system. Such a mirror cache system carries the penalty, of course, that if each word unit is written twice, the capacity of the cache memory system is effectively cut in half.

There may be situations where the mirroring of data in two cache modules is not required. For example, if the data is only to be read, it is not necessary to write such data from main memory to two cache modules. This is true because if the data is lost from the cache module where it is written, it may be recovered from main memory. Also, users of the system may opt to have greater cache capacity rather than to mirror write data in two cache modules. In such a non-mirror system more elaborate recovery procedures are required in the event of a failure of cache, but the user may be willing to pay this price so as to have a larger cache capacity.

What is needed is a cache memory system that provides the user with flexibility in trading off cache capacity with mirror data caching in two cache modules.

SUMMARY OF THE INVENTION

In accordance with this invention, the above problem has been solved by enabling one of a of cache modes in a cache memory system in a computer, the cache memory system having a first controller and two cache memories, the cache memories being partitioned into quadrants with two quadrants in each cache memory. A cache mode detector in the first controller detects a mirror cache mode set for the cache memory system. An address enabler in the first controller enables access to first pair of quadrants, one quadrant in each cache memory, in response to detection of a mirror cache mode. A second controller follows the cache mode set by the cache mode detector and has an address enabler. The address enabler in the second controller enables access to both quadrants in one cache memory in a non-mirror cache mode, and enables the access to a second pair of quadrants, one quadrant in each cache memory, in response to detection of a mirror cache mode by said cache mode detector.

As another feature of the invention the cache mode detector detecting a partial mirror cache mode in addition to the mirror cache mode. The address enabler in the first controller then enables access to a first pair of quadrants, one quadrant in each cache memory, in response to detection of the partial mirror cache mode. The access to the first pair is a mirror write access to a mirror-write region in each quadrant of the first pair and a non-mirror access to a non-mirror region in each quadrant of the first pair. The address enabler in the second controller enables access to a second pair of quadrants, one quadrant in each cache memory, in response to detection of the partial mirror cache mode. The access to the second pair is a mirror write access to a mirror-write region in each quadrant of the second pair and a non-mirror access to a non-mirror region in each quadrant of the second pair.

The great advantage and utility of the present invention is the versatility to enable a partial mirror mode. The user may then trade-off cache capacity for mirror-write redundancy in various proportions.

The foregoing and other features, utilities and advantages of the invention will be apparent from the following more particular description of a preferred embodiment of the invention as illustrated in the accompany drawings.

DETAILED DESCRIPTION OF THE PREFERRED EMBODIMENTS

Figure 1:
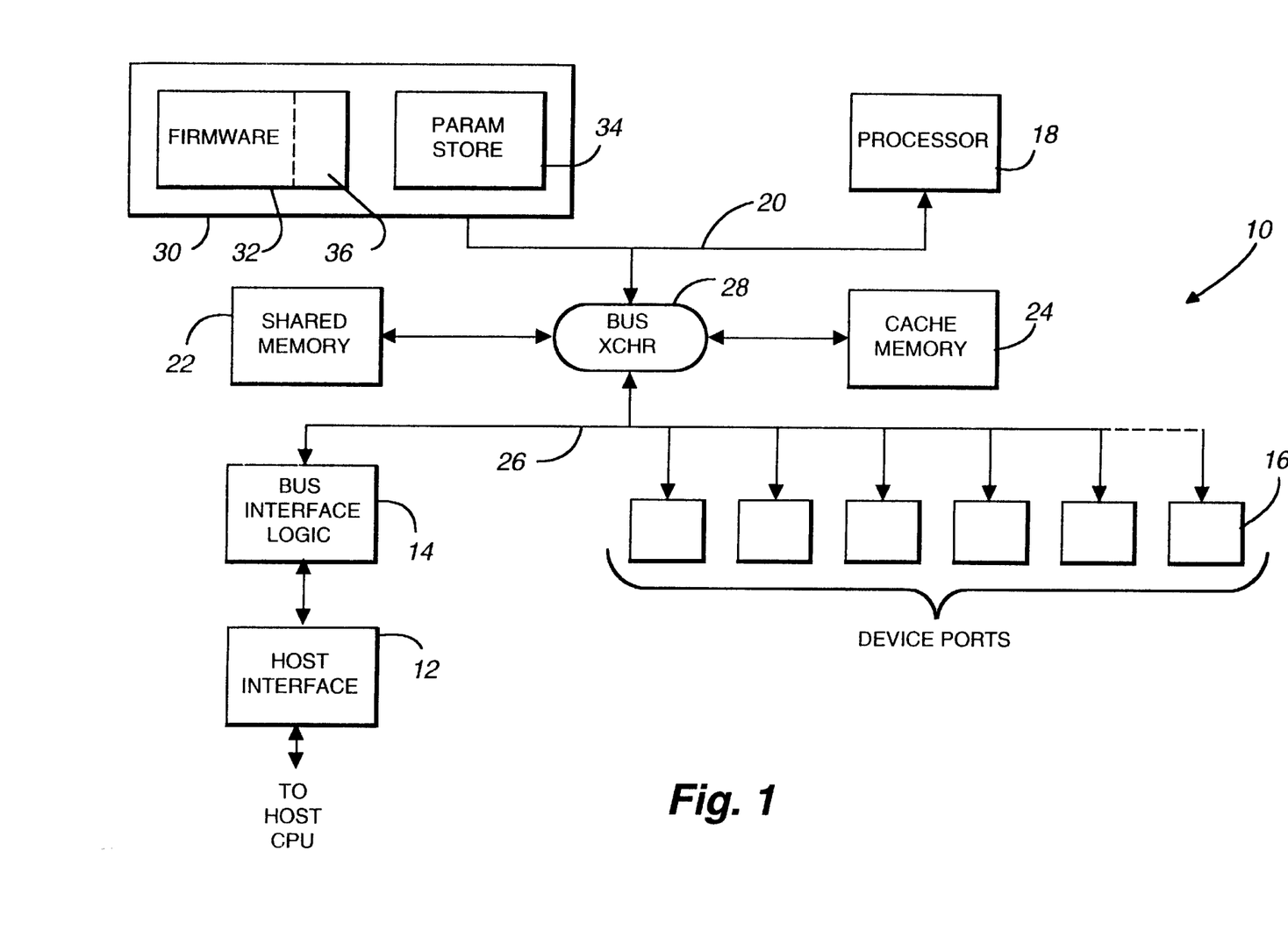
FIG. 1 illustrates a controller for performing the operations in the preferred embodiments of the invention.

Each of the storage controllers in the dual controllers, dual cache modules preferred embodiment of the present invention are implemented in a digital computing system environment, as illustrated by the storage controller 10 in FIG. 1. Storage controller 10 bridges a host interface 12 via a bus interface logic block 14 to one or more device ports 16. These device ports provide an access path to physical media (not shown). Controller 10 further includes a processor 18 residing on a native bus 20. Also included in the controller are a cache memory 24 and a shared memory 22.

Separate buses connected to shared memory 22 and cache memory 24 are interconnected to the native bus 20 and a bus 26 by way of a bus exchanger 28. Bus 26 is used to access the host interface through the bus interface logic block 14 and to access device ports 16. The bus exchanger is a cross bar which provides fast access by all entities to all parts of the controller. In addition to providing required bus interface logic, the bus interface logic block 14 includes other functional components needed to perform low-level device and host port operation support.

Sharing the native bus 20 used by the processor is a non-volatile memory 30. The non-volatile memory 30 stores the controller firmware 32 and parameter data 34. Non-volatile memory 30 is read each time the controller boots. Included as a subcomponent of the firmware is the caching firmware 36. Although the firmware is contained in non-volatile memory 30, it is copied to shared memory 22 at initialization of the controller for subsequent execution by processor 18. In accordance with the preferred embodiment of this invention, the caching operations described hereinafter are performed by processor 18 working with the caching firmware and operating on cache modules represented by cache memory 24 in FIG. 1.

Figure 2A:
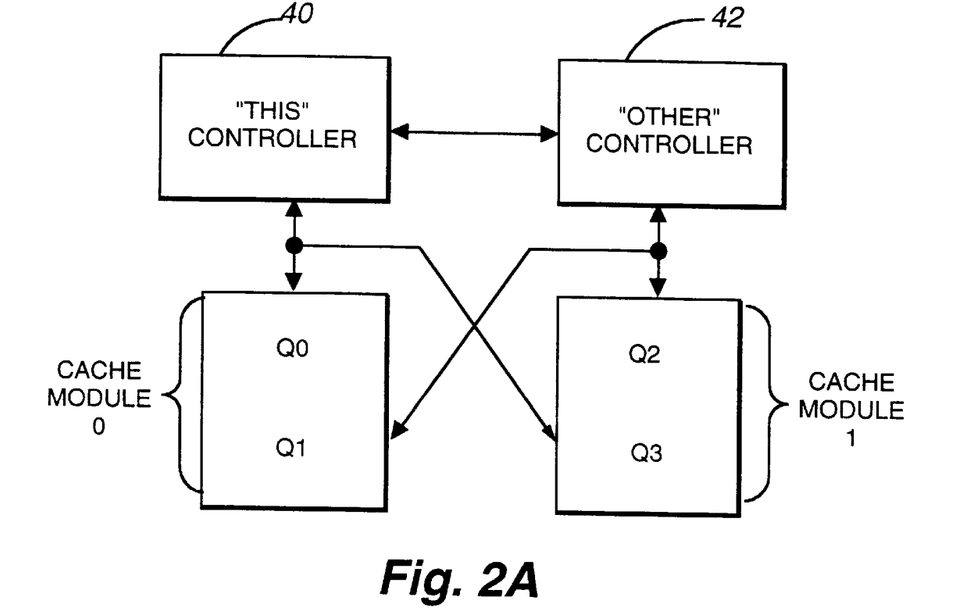
FIG. 2A is an information flow diagram for mirror mode operations in accordance with a preferred embodiment of the invention.

FIG. 2A illustrates the flow of information in a mirror write mode in the preferred embodiment of the invention where dual controllers and dual cache modules are utilized. The architecture of this dual controller/dual cache module configuration is described in detail in copending commonly-assigned application entitled "Simultaneous, Mirror Write Cache" cross-referenced above and incorporated herein by reference. In this dual controller/dual cache architecture the two cache modules 0 and 1 are divided in half so as to form four cache quadrants Q0, Q1, Q2 and Q3. The two controllers are identical to each other and are identified as "THIS" controller 40 and "OTHER" controller 42. Each of these controllers has access to all of the quadrants Q0 through Q3. With such an architecture, a failure of a cache module or a failure of one of the controllers still permits access to all data in a good quadrant of a cache module.

Figure 2B:
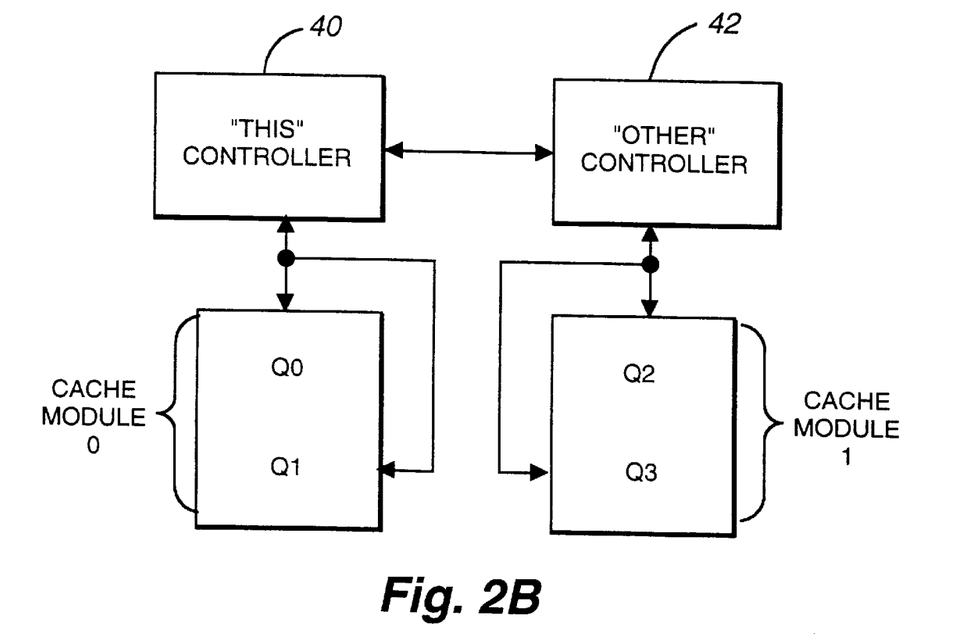
FIG. 2B is an information flow diagram for non-mirror mode operations in accordance with a preferred embodiment of the invention.

FIG. 2A illustrates the simultaneous mirror write cache mode flow of information between controllers and between each controller and the cache modules. In simultaneous mirror write, "THIS" controller 40 has simultaneous access to quadrants Q0 and Q3 for writing the same data word simultaneously in both of these quadrants. Similarly, "OTHER" controller 42 has simultaneous access to quadrants Q1 and Q2 to simultaneously write the same data word unit to quadrants Q1 and Q2. FIG. 2B represents the same architectural cache memory system as FIG. 2A, except that FIG. 2B is operating in non-mirror cache mode. In non-mirror mode, THIS controller 40 has access to all of cache module 0, but is writing or reading only to Q0 or Q1 in a given read/write cycle. Similarly, OTHER controller 42 in a read/write cycle reads or writes data to one location in cache module 1, quadrants Q2 or Q3. As discussed above, while THIS controller normally writes to cache module 0 in the non-mirror mode, THIS controller 40 has the capability of also reading and writing to cache module 1. Similarly, OTHER controller 42 has the capability of writing to cache module 0 in non-mirror mode.

Figure 2C:
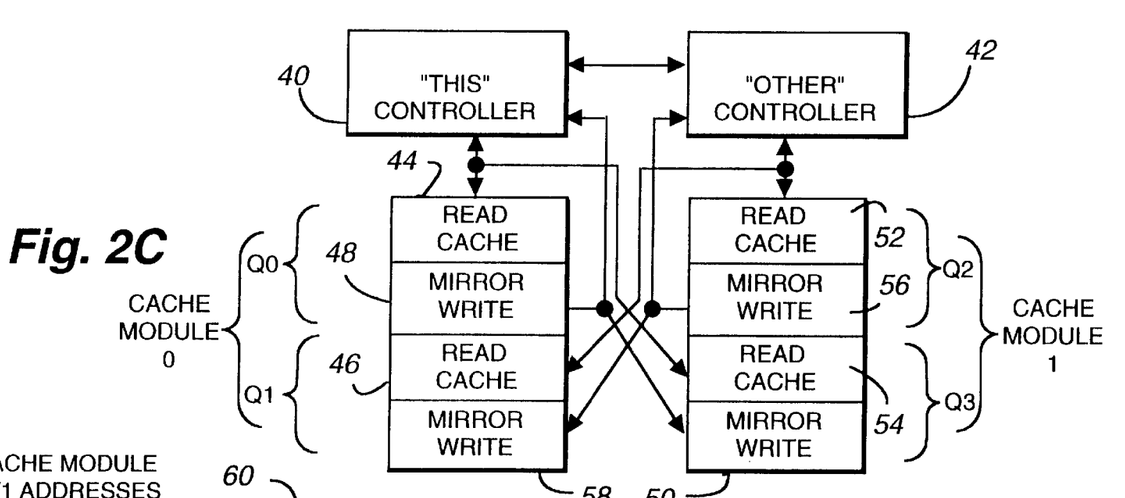
FIG. 2C is an information flow diagram for partial mirror mode operations in accordance with a preferred embodiment of the invention.

FIG. 2C illustrates the flow of information where the cache memory system is operating in a partial mirror mode. In partial mirror mode, a region of each quadrant is used in mirror mode, and the remaining region in the quadrant is used in non-mirror mode. In the preferred embodiment, the non-mirrored region is a read cache region used only for reading data word units from cache that have been previously loaded from shared memory. As shown in FIG. 2C, THIS controller 40 has read access to read cache region 44 of quadrant Q0 and read cache region 54 of quadrant Q3.

THIS controller also has mirror write access for simultaneously writing in a mirror write region 48 of quadrant Q0 and mirror write region 50 of quadrant Q3. In a like manner in the partial mirror mode of FIG. 2C, OTHER controller 42 has non-mirror access to read cache in 52 of quadrant Q2 and read cache region 54 of quadrant Q1. For mirror write operation, OTHER controller 42 has simultaneous access to mirror write region 56 of quadrant Q2, and mirror write region 58 of quadrant Q1.

The advantage of the partial mirror mode is the increased capacity of the cache memory system when compared to mirror mode. For example, if the size of each cache module is 128 Megabytes, then in mirror mode, as depicted in FIG. 2A, each quadrant is 64 Megabytes and the total capacity of cache memory system in FIG. 2A is 128 Megabytes. In non-mirror mode in FIG. 2B, there is no mirror writing and, therefore, the capacity of the cache memory system is 256 Megabytes, i.e., 128 Megabytes per cache module. A larger cache capacity is desireable to achieve better performance. Minimizing redundant use of memory is important considering fast memory is relatively expensive.

In partial mirror mode in FIG. 2C, if mirror write regions are 32 Megabytes in each quadrant, then the read cache region will also be 32 Megabytes in each quadrant. Thus, in each cache module, the capacity is 64 Megabytes of non-mirror data and 64 Megabytes of non-mirror data that is also written in the other cache module. In effect, the capacity of such a partial mirror cache memory system is 192 Megabytes or effectively, 96 Megabytes per cache module. (Half of the mirror written capacity is not counted because the data is duplicated.)

A significant feature of the invention, as mentioned in the Summary of the Invention, is that the boundary between the non-mirror region and the mirror region during a partial mirror mode is adjustable. The boundary between non-mirror and mirror regions is defined by addresses predetermined by the user. The user merely defines a base address and the controller increments from the base address to locate a given data word unit in a non-mirror region or a mirror region.

Figure 2D:
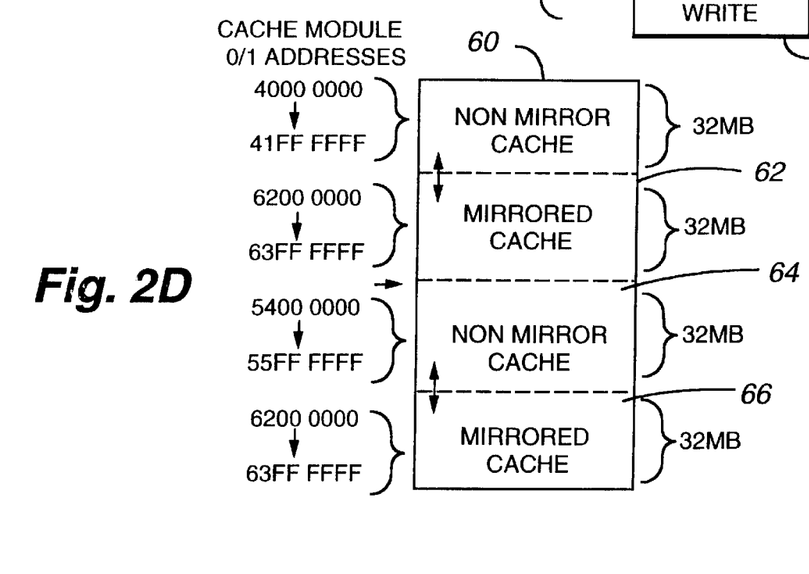
FIG. 2D illustrates an example of addresses that could be used in partial mirror mode.

FIG. 2D illustrates an example of the addresses that are used in the preferred embodiment to divided 128 Megabyte cache module into four 32 Megabyte regions. The first non-mirror region is addressed at a base address of 4000 0000 hexadecimal and runs to an address of 41FF FFFF. All addresses referred to herein are hexadecimal addresses. The mirrored cache region begins at a address of 6200 000 and runs through 63FF FFFF. Note that the boundary between the non-mirror region 60 and the mirror region 62 may simply be changed by changing the base address 6200 000 of the mirror region 62. Of course, if the mirror region 62 increases above 32 Megabytes, the non-mirror region 60 must decrease below 32 Megabytes. Base addresses for the lower 64 Megabytes of the cache module in FIG. 2D are defined as 5400 0000 for non-mirror region and 6200 0000 for the mirror region. Mirror regions 62 and 66 have the same base address but are being accessed from different controller.

While the mirror regions and non-mirror regions have been described and illustrated as continuous regions, the regions do not need to be continuous. If address translation is used, not all the mirrored data or the non-mirror data need to be contiguous space. The mirror and non-mirror regions might be intermixed, i.e. the mirror and non-mirror written data might be interspersed with each other.

Figure 3:
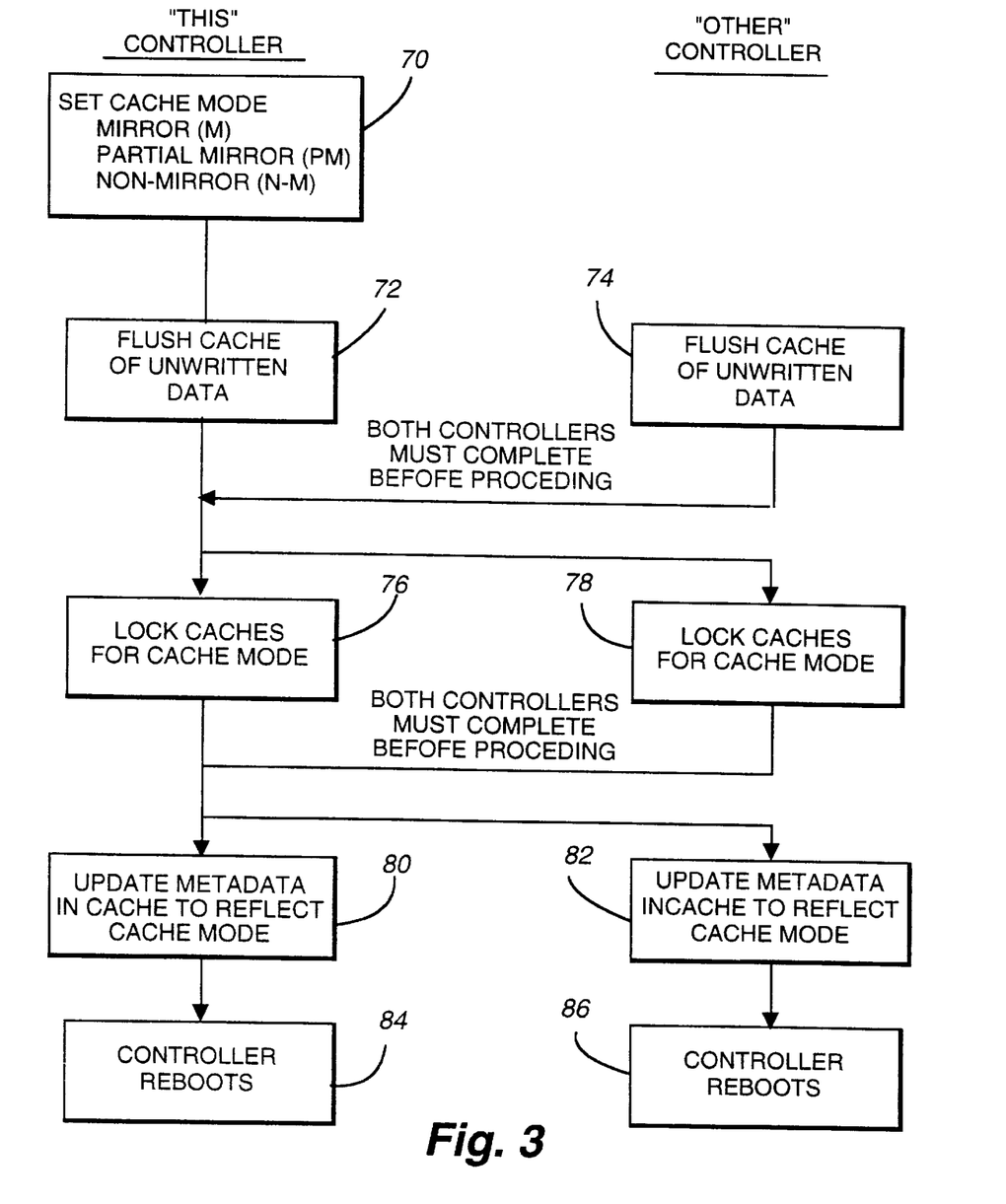
FIG. 3 illustrates operations performed to change cache modes.

The operations performed by the controllers in enabling the cache modes begin with the operation flow diagram of FIG. 3. FIG. 3 has a flow for both of the controllers and indicates the interaction between the controllers. The flow of operations in THIS controller 40 are indicated at the left side of FIG. 3, and the flow of operations in OTHER controller 42 are indicated in the right side of FIG. 3. The flow could begin with either controller. It is assumed in FIG. 3 that the flow starts with THIS controller.

In operation 70, THIS controller receives a set cache mode indication from a command line interpreter. The command line entered by the user may specify mirror mode, partial mirror mode or non-mirror mode. When a set cache mode is received, operation 72 in THIS controller and operations 74 in OTHER controller flush the cache of unwritten data. In other words, before resetting the cache mode, any data in either the cache modules that has not been written back to disk is written back to disk and flushed out of the cache module. After both controllers have completed their respective operations at 72 and 74, operation 76 in THIS controller and operation 78 in OTHER controller lock the cache modules for the new cache mode. When the lock operations are completed by both controllers, operation 80 in THIS controller and operation 82 in OTHER controller update the metadata their respective cache module to reflect the changing cache mode. When this is completed at each controller, the controllers reboot in operation 84 and 86, respectively.

The reboot operations by the controllers proceed in parallel, and the controller that works through the reboot sequence first locks both of the cache modules. For purposes of describing the operations, it will be assumed that THIS controller 40 completes its reboot operation before OTHER controller 42. The operations performed by THIS controller 40 are illustrated in FIG. 4A.

Figure 4A:
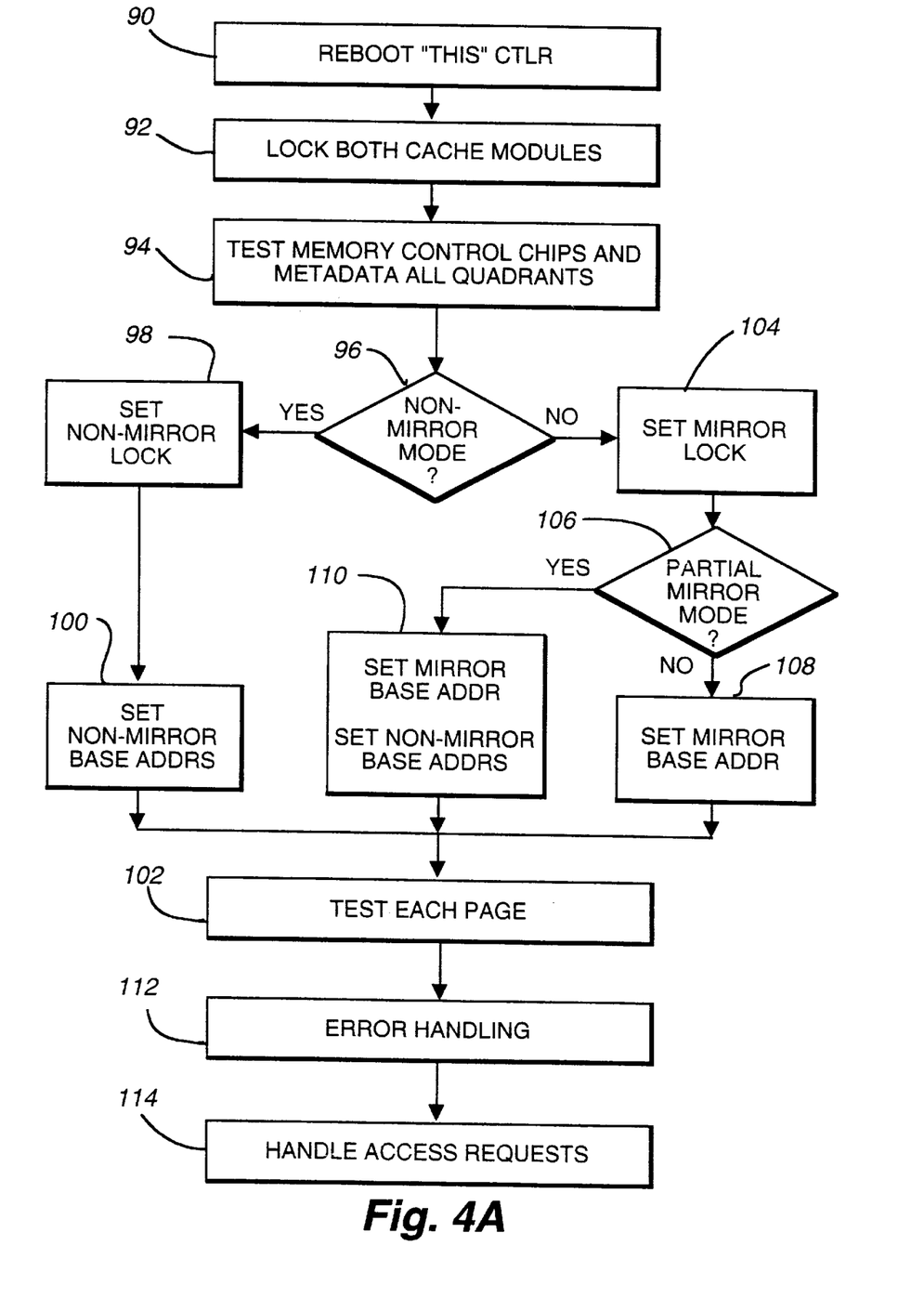
FIG. 4A is an operation flow for changing cache modes in one of the controllers in the dual controllers, dual cache system.

In FIG. 4A, after THIS controller completes its reboot sequence in operation 90, THIS controller locks both cache modules in operation 92. The cache modules are locked so that a sample test can be run on all of the quadrants Q0, Q1, Q2, and Q3. Operation 94 runs a sample test of the memory control chips for the cache modules and also samples the metadata in all quadrants. After the test is successfully completed, decision operation 96 detects whether the new cache mode is non-mirror mode.

If the new mode is non-mirror, the operation flow branches YES to operation 98 where THIS controller sets a non-mirror lock. Then operation 100 sets the non-mirror base address. After the non-mirror lock and base address have been set, each page in the cache modules is tested by operation 102.

If the new cache mode is not non-mirror, i.e., it is mirror or partial mirror, then the operation flow branches from decision operation 96 to operation 104. Operation 104 sets a mirror lock for THIS controller. Decision operation 106 then tests whether the cache mode is partial mirror. If it is not partial mirror, the operation branches NO from operation 106 to operation 108. Operation 108 sets the mirror base address. Thereafter, test operation 102 tests each page of the quadrants in the cache modules.

If decision operation 106 detects that the new cache mode is partial mirror, then the operation flow branches YES from decision operation 106 to operation 110. Operation 110 sets the mirror base address and also sets the non-mirror base addresses to be used in the partial mirror mode operations. After setting both the mirror and non-mirror base addresses, each page in the mirror region and non-mirror region are tested as represented by operation 102. The details of operation 110 when operating with operation 102 are described hereinafter in more detail with reference to FIG. 5.

After page testing is completed in operation 102, for the mode that has been set, operation 112 handles errors or faults detected by the page testing. After the error handling operation, the controller is ready to handle read/write access requests from the host. Operation 114 handles these access requests with the mode locks and base addresses set by controller.

Figure 4B:
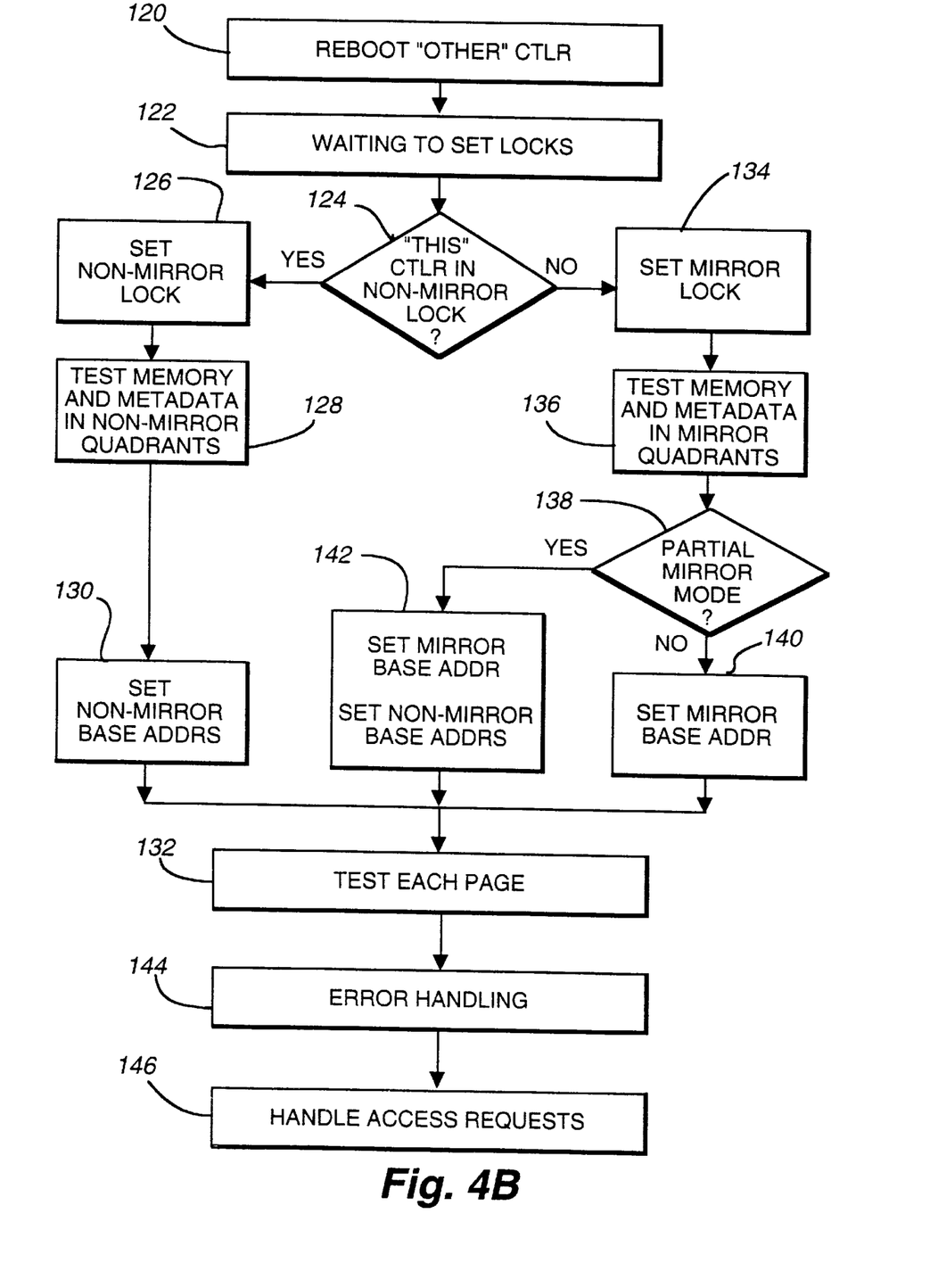
FIG. 4B is an operation flow for changing cache modes in the other controller in the dual controllers, dual cache system.

FIG. 4B illustrates the operations performed by the "OTHER" controller in setting its locks and base addresses to be used depending upon the cache mode. When the OTHER controller reboot sequence is completed at operation 120 in FIG. 4B, the OTHER controller waits in operation 122 to set its locks in response to locks set by THIS controller in the operation described for FIG. 4A. After THIS controller sets its locks, decision operation 124 detects the lock at THIS controller and tests whether a non-mirror lock has been set. If the non-mirror lock has been set, the operation flow branches YES from decision operation 124 to set operation 126. Operation 126 now sets the non-mirror lock in the OTHER controller. After the non-mirror lock is set, operation 128 tests the memory controls and sample tests the metadata in non-mirror quadrants to verify operability of the cache module and non-mirror quadrants. After the test in operation 128 is completed successfully, the non-mirror base address is set for the quadrants to be accessed by the OTHER controller. When operation 130 finishes setting the non-mirror base address, operation 132 then tests each page in the quadrant addressed by the OTHER controller.

If decision operation 124 detects that THIS controller did not set a non-mirror lock, then the operation flow branches NO from decision operation 124 to set operation 134. Operation 134 sets a mirror lock for the OTHER controller and passes operation flow to test operation 136. Test operation 136 tests the memory control chips and samples the metadata in the mirror quadrants addressed by the OTHER controller. If the test is passed successfully, decision operation 138 detects whether the cache mode set by THIS controller was the partial mirror mode. If the cache mode was not partial mirror mode, operation flow branches NO from decision operation 138 to set operation 140. Operation 140 sets the mirror base address to be used by the OTHER controller in addressing the mirror quadrants.

If the mode set by THIS controller was partial mirror mode, then the OTHER controller will detect the partial mirror mode and at operation 138, the operation flow branches Yes to set operation 142. Set operation 142 sets the mirror base address and also sets the non-mirror base address in the mirror quadrants controlled by the OTHER controller. The mirror base address may be specified by the user as apart of the partial mode command. Thus, the portion of the mirror quadrant that is to be used for mirror write is adjustable in response the user's command. The test each page operation 132 and the error handling operation 144 and the handle access operation 146 are all the same as previously discussed for THIS controller with reference to FIG. 4A.

Figure 5:
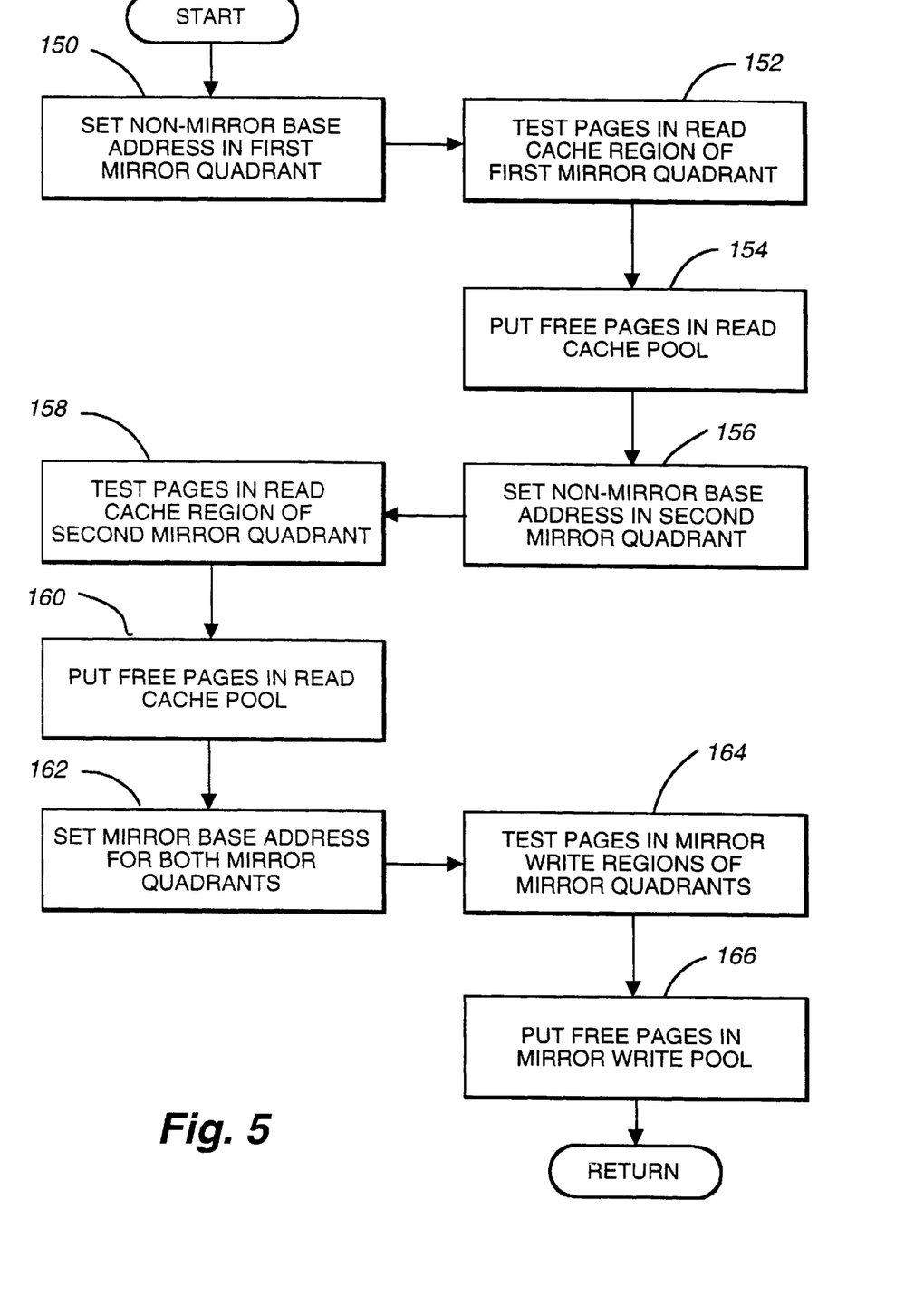
FIG. 5 is an operation flow for setting up each controller and testing pages in cache in order to change to partial mirror mode.

FIG. 5 illustrates the operation flow in partial mirror mode for setting non-mirror base addresses and mirror base address and testing pages. In other words, FIG. 5 illustrates in more detail operations 110 and 102 from FIG. 4A and operation 142 in combination with operation 132 in FIG. 4B.

In FIG. 5, partial mirror mode starts first by operation 150 setting the non-mirror base address in the first mirror quadrant. In the example of FIG. 2C, this would be the base address at the beginning of read cache region 44 in quadrant Q0. For OTHER controller 42 in FIG. 2C, operation 150 would set the base address for read cache region 52 in quadrant Q2.

After the read cache base address for the first mirror quadrant, operation 152 tests pages in that read cache region. All free pages in the read cache region are placed in a read cache pool as a listing stored in a shared memory 22 (FIG. 1). The listing of free pages in read cache pool is performed by operation 154.

Next, operation 156 then sets a non-mirror base address in a second mirror quadrant to establish the beginning of the read cache region for the second mirror write quadrant of the same controller. In the example illustrated in FIG. 2C, operation 156 would set the base address for read cache region 54 in quadrant Q3. After this read cache region base address is set, operation 158 tests pages in the read cache region of this second mirror quadrant. If free pages are found in this region, operation 160 places those free pages in the read cache pool listing in shared memory. At this point, both read cache regions in the mirrored quadrants (Q0, Q3 for THIS controller 40) have had their base addresses set and the pages tested.

Operation 162 sets the mirror base address for both mirror quadrants. The base address for the mirror write region of both mirror quadrants is the same. Thus, the mirror base address specifies the first address position in mirror write region 48 of quadrant Q0 and mirror write region 54 of quadrant Q3 when THIS controller 40 is setting the mirror base address. Conversely, if OTHER controller 42 had set the mirror base address, the mirror base address would be the first address position in mirror write regions 56 and 58 of quadrants Q2 and Q1, respectively. It is this mirror based address that is controllable by the user when setting the partial mirror mode with a command. The user may thus increase the mirror write region, or decrease the mirror write region by specifying this mirror base address. Also, the non-mirror region does not need to be the first addressed region. The mirror region might be followed by the non-mirror region in the quadrant.

After the mirror base address is set, operation 164 tests pages in the mirror write regions of both mirror quadrants. As the pages are tested, free pages are identified and placed in a mirror write pool by operation 166. Operation 166 puts the free pages in the mirror write pool stored in shared memory. This completes the setting of base addresses in partial mirror mode and testing of pages in non-mirror regions and mirrored regions in partial mirror mode. From operation 166 in FIG. 5, the operation flow would return to operation 112 error or fault handling.

While the invention has been particularly shown and described with reference to preferred embodiments thereof, it will be understood by those skilled in the art that various other changes in the form and details may be made therein without departing from the spirit and scope of the invention.

What is claimed is:

1. A method for operating between a non-mirror cache mode and one or more mirror cache modes in a cache memory system, the cache memory system having a controller, a first cache memory and a second cache memory, comprising the computer implemented steps of:

detecting by the controller a cache mode to be used by the cache memory system;

dividing each of the cache memories into two mirror portions upon detection of one of the mirror cache modes; and simultaneously writing the same data by the controller to one of the mirror portions in the first cache memory and one of the mirror portions in the second cache memory.

2. The method of claim 1 wherein the cache mode detected is non-mirror cache mode further comprising the steps of:

writing data by the controller to one of the cache memories.

3. The method of claim 1 wherein the cache mode detected is mirror cache mode further comprising the steps of:

dividing the entire first cache memory into two mirror portions and the entire second cache memory into two mirror portions.

4. The method of claim 1 wherein the cache mode detected is partial mirror cache mode further comprising the steps of:

dividing each of the cache memories into two mirror portions and one non-mirror portion;

simultaneously writing by the controller the same data to a mirror portion in the first cache memory and a mirror portion in the second controller; and writing by the controller data to the non-mirror portion in one of the cache memories.

5. The method of claim 1 and in addition:

detecting by a second controller the cache mode to be used by the cache memory system.

6. The method of claim 5 wherein the cache mode detected is non-mirror cache mode and further comprising:

writing data by the controller to one of the cache memories; and writing another data by the second controller to the other cache memory.

7. The method of claim 5 wherein the cache mode detected is mirror cache mode further comprising:

dividing the entire first cache memory into two mirror portions and the entire second cache memory into two mirror portions; and simultaneously writing another same data to the other mirror portion of the first cache memory and the other mirror portion of the second cache memory.

8. The method of claim 5 wherein the cache mode is partial mirror cache mode:

dividing each of the cache memories into two mirror portions and one non-mirror portion;

simultaneously writing by the controller the same data to a mirror portion in the first cache memory and a mirror portion in the second controller;

simultaneously writing by the second controller the same data to another mirror portion in the first cache memory and another mirror portion in the second controller;

writing by the controller data to the non-mirror portion in one of the cache memories; and writing by the second controller data to the non-mirror portion in the other cache memory.

9. The method of claim 5 further comprising the steps of:

first testing pages in the non-mirror portion of the cache memories; and putting free pages detected by the first testing step into a non-mirror pool.

10. The method of claim 5 further comprising the steps of:

second testing pages in the mirror portions of the cache memories; and putting free pages detected by the second testing step into a mirror pool.

11. Apparatus for operating between a non-mirror cache mode and one or more mirror cache modes in a cache memory system comprising:

a first cache memory and a second cache memory; and a controller, such controller comprising:

a cache mode detector logic for detecting and setting the cache mode for the cache memory system;

a cache division logic for dividing each of the first cache memory and the second cache memory into two mirror portions upon detection of one of the mirror cache modes; and a memory write control logic for simultaneously writing the same data by the controller to one of the mirror portions in the first cache memory and one of the mirror portions in the second cache memory.

12. The apparatus of claim 11 and in addition:

a second controller, such second controller comprising:

a cache mode detector logic for detecting the cache mode set by the controller; and a memory write control logic for simultaneously writing the same data by the second controller to the other mirror portion in a first cache memory and the other mirror portion in the second cache memory.

13. The apparatus of claim 12 wherein the cache mode detector logic detecting mirror cache mode:

the cache division logic dividing each of the entire first cache and the entire second cache into two mirror portions.

14. The Apparatus of claim 12 wherein the cache mode detection logic detecting non-mirror cache mode:

the memory write control logic in the controller writing data to the first cache memory; and the memory write control logic in the second controller writing data to the second cache memory.

15. The apparatus of claim 12 wherein the cache mode detector logic detecting partial mirror cache mode:

the cache division logic dividing each of the first and second cache memories into two mirror portions and one non-mirror portion;

the memory write control logic in the controller writing other data to the non-mirror portion in the first or the second cache memory; and the memory write control logic in the second controller simultaneously writing second same data to another mirror portion in the first cache memory and another mirror portion in the second cache memory and writing second other data to the other non-mirror portion in the first or the second cache memory.

16. A method for operating between a non-mirror cache mode and one or more mirror cache modes in a cache memory system, the cache memory system having, a first cache memory and a second cache memory, comprising the computer implemented steps of:

detecting the cache mode to be used by the cache memory system;

dividing each of the cache memories into two mirror portions upon detection of one of the mirror cache modes; and simultaneously writing the same data to one of the mirror portions in the first cache memory and one of the mirror portions in the second cache memory.

* * * * *